(12) United States Patent
Kenney

(10) Patent No.: US 11,303,282 B1
(45) Date of Patent: Apr. 12, 2022

(54) TECHNIQUES FOR MEASURING SLEW RATE IN CURRENT INTEGRATING PHASE INTERPOLATOR

(71) Applicant: Analog Devices, Inc., Wilmington, MA (US)

(72) Inventor: John Kenney, West Windsor, NJ (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/382,104

(22) Filed: Jul. 21, 2021

Related U.S. Application Data

(63) Continuation of application No. 17/116,875, filed on Dec. 9, 2020, now Pat. No. 11,165,431.

(51) Int. Cl.
*H03L 7/081* (2006.01)
*H03L 7/183* (2006.01)

(52) U.S. Cl.
CPC .......... *H03L 7/0816* (2013.01); *H03L 7/0818* (2013.01); *H03L 7/183* (2013.01)

(58) Field of Classification Search
CPC ...... H03L 7/0816; H03L 7/0818; H03L 7/183
See application file for complete search history.

(56) References Cited

U.S. PATENT DOCUMENTS

| | | | | |
|---|---|---|---|---|
| 6,157,688 A * | 12/2000 | Tamura | ............... | H04L 25/0276 375/348 |
| 7,143,125 B2 * | 11/2006 | Gradishar | ............... | G06F 1/025 708/271 |
| 7,323,916 B1 * | 1/2008 | Sidiropoulos | ........... | H03L 7/081 327/147 |
| 7,848,473 B2 * | 12/2010 | Freyman | ............... | H03L 7/0818 375/362 |
| 8,519,761 B1 * | 8/2013 | Kossel | ..................... | H03K 5/13 327/170 |
| 8,638,149 B1 * | 1/2014 | Kossel | ............. | H03K 19/00361 327/170 |
| 8,653,869 B2 * | 2/2014 | Kao | ....................... | H03L 7/1974 327/159 |
| 8,692,599 B2 * | 4/2014 | Gong | ..................... | H03L 7/081 327/159 |
| 8,723,570 B2 * | 5/2014 | Chang | ....................... | H03L 7/08 327/158 |
| 8,963,588 B2 * | 2/2015 | Da Dalt | ................ | H03L 7/1976 327/117 |

(Continued)

*Primary Examiner* — Adam D Houston
(74) *Attorney, Agent, or Firm* — Patent Capital Group

(57) ABSTRACT

An apparatus is described and includes a current integrating phase interpolator core having a programmable bias current; an inverter circuit coupled to an output of the current integrating phase interpolator core for receiving a signal comprising a periodic sawtooth waveform therefrom; a digital-to-analog (D/A) converter for setting an input common mode voltage of the inverter circuit; a duty cycle measurement (DCM) circuit for measuring a duty cycle distortion (DCD) of a clock signal output from the inverter circuit; and a circuit for computing a difference between a first state of the DCD of the clock signal corresponding to the input common mode voltage of the inverter circuit being set to a high voltage and a second state of the DCD of the clock signal corresponding to the input common mode voltage of the inverter circuit being set to a low voltage.

20 Claims, 13 Drawing Sheets

(56) References Cited

U.S. PATENT DOCUMENTS

| | | | |
|---|---|---|---|
| 9,160,345 B1* | 10/2015 | Gorecki | H03L 7/0807 |
| 9,362,936 B1* | 6/2016 | Caffee | H03K 5/135 |
| 10,742,227 B1* | 8/2020 | Schifmann | H03F 3/213 |
| 11,165,431 B1* | 11/2021 | Kenney | H03L 7/183 |
| 2001/0009275 A1* | 7/2001 | Jung | H03L 7/07 |
| | | | 257/1 |
| 2008/0079510 A1* | 4/2008 | Seethamraju | H03L 7/18 |
| | | | 331/179 |
| 2008/0164917 A1* | 7/2008 | Floyd | H03L 7/1974 |
| | | | 327/117 |
| 2009/0146752 A1* | 6/2009 | O'Day | H03B 5/1228 |
| | | | 331/176 |
| 2009/0290624 A1* | 11/2009 | Thurston | G01R 31/31709 |
| | | | 375/221 |
| 2010/0007393 A1* | 1/2010 | Seefeldt | H03L 7/099 |
| | | | 327/175 |
| 2010/0315119 A1* | 12/2010 | Welker | H04L 25/08 |
| | | | 326/30 |
| 2011/0310520 A1* | 12/2011 | Christensen | H04B 1/0458 |
| | | | 361/91.1 |
| 2012/0025888 A1* | 2/2012 | Kossel | G06F 1/04 |
| | | | 327/299 |
| 2012/0045076 A1* | 2/2012 | Gonano | H03F 3/217 |
| | | | 381/120 |
| 2012/0086486 A1* | 4/2012 | Na | H03L 7/0818 |
| | | | 327/158 |
| 2013/0055006 A1* | 2/2013 | Kossel | G06F 1/04 |
| | | | 713/503 |
| 2014/0159933 A1* | 6/2014 | Dufrene | H03M 1/66 |
| | | | 341/144 |
| 2015/0145571 A1* | 5/2015 | Perrott | H03L 7/093 |
| | | | 327/159 |
| 2015/0249454 A1* | 9/2015 | Giaconi | H04L 7/0332 |
| | | | 375/376 |
| 2016/0294332 A1* | 10/2016 | Quilligan | H03F 3/387 |
| 2016/0329868 A1* | 11/2016 | Liu | H03F 3/2173 |
| 2016/0373047 A1* | 12/2016 | Loken | H02P 29/68 |
| 2016/0373120 A1* | 12/2016 | Caffee | H03L 7/183 |
| 2018/0131378 A1* | 5/2018 | Haroun | H03K 5/135 |
| 2019/0288830 A1* | 9/2019 | Zhuang | H03L 7/0814 |
| 2020/0119721 A1* | 4/2020 | Mozak | H03K 5/135 |
| 2020/0220528 A1* | 7/2020 | Koh | G06F 1/10 |
| 2020/0373927 A1* | 11/2020 | Liang | H03L 7/18 |

\* cited by examiner

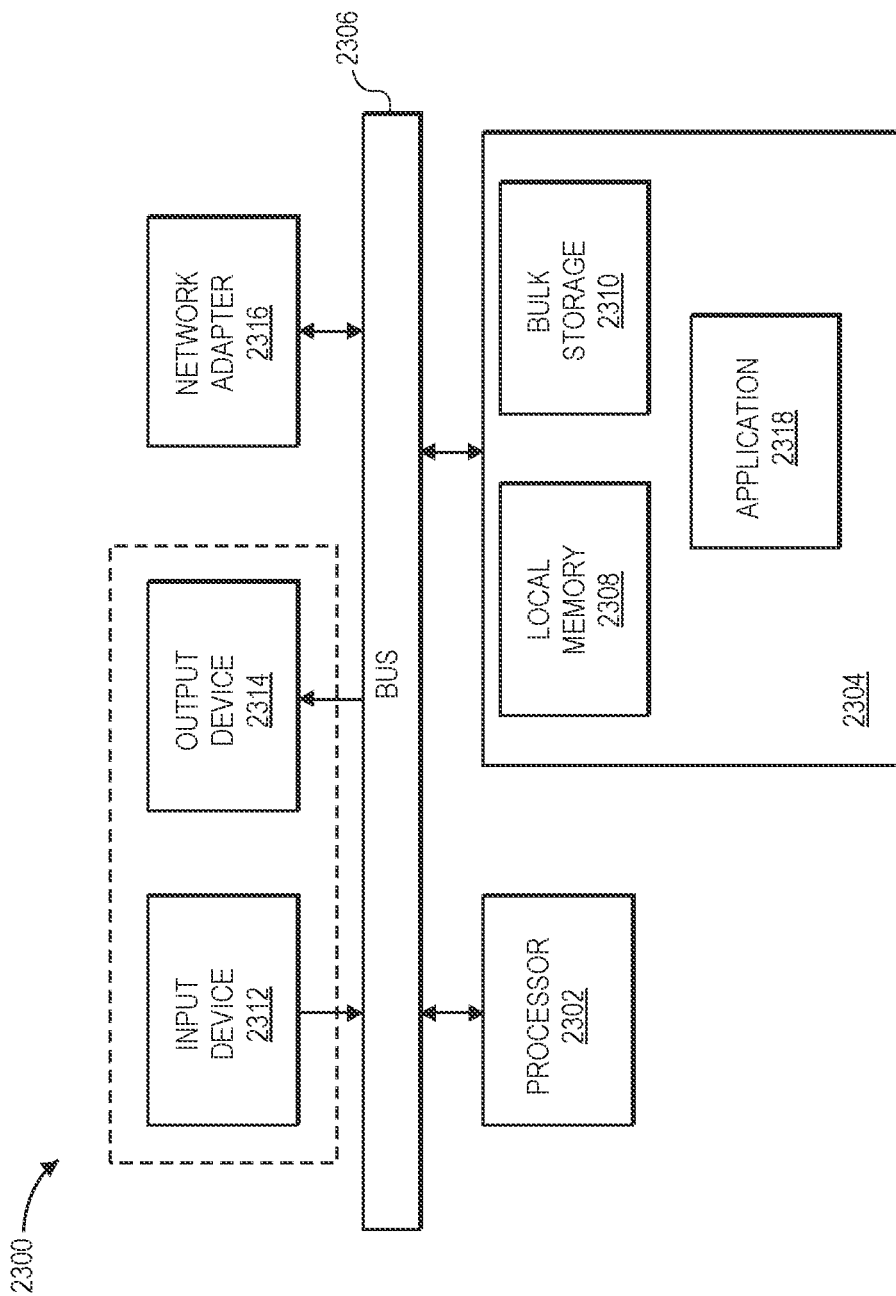

TECHNIQUES FOR MEASURING SLEW RATE IN CURRENT INTEGRATING PHASE INTERPOLATOR

RELATED APPLICATIONS

The present application claims priority to, as a continuation, to U.S. Nonprovisional application Ser. No. 17/116,875, filed Dec. 9, 2020, entitled, "TECHNIQUES FOR MEASURING SLEW RATE IN CURRENT INTEGRATING PHASE INTERPOLATOR". The U.S. Nonprovisional application is incorporated by reference in its entirety.

FIELD OF THE DISCLOSURE

This disclosure relates generally to the field of current integrating phase interpolators and, more particularly, to techniques for measuring slew rate in a current integrating phase interpolator (CIPI).

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 12 provides a block diagram illustrating an example data processing system that may be configured to control operation of one or more systems configured to provide slew rate measurement in a CIPI, according to some embodiments of the present disclosure.

DETAILED DESCRIPTION OF EXAMPLE EMBODIMENTS

Figure 1A:
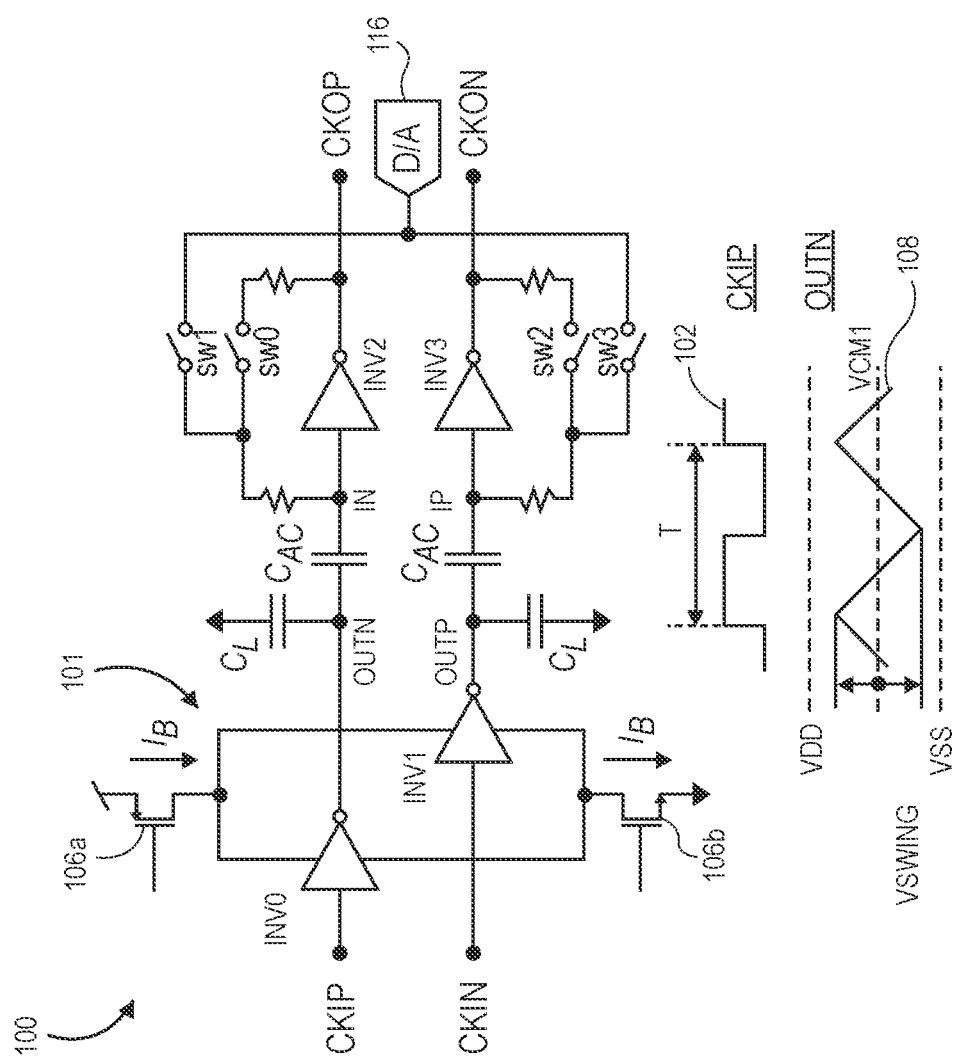
FIGS. 1A and 1B collectively illustrates a schematic block diagram of a circuit for measuring slew rate in a current integrating phase interpolator (CIPI) in accordance with embodiments described herein.
Figure 1B:
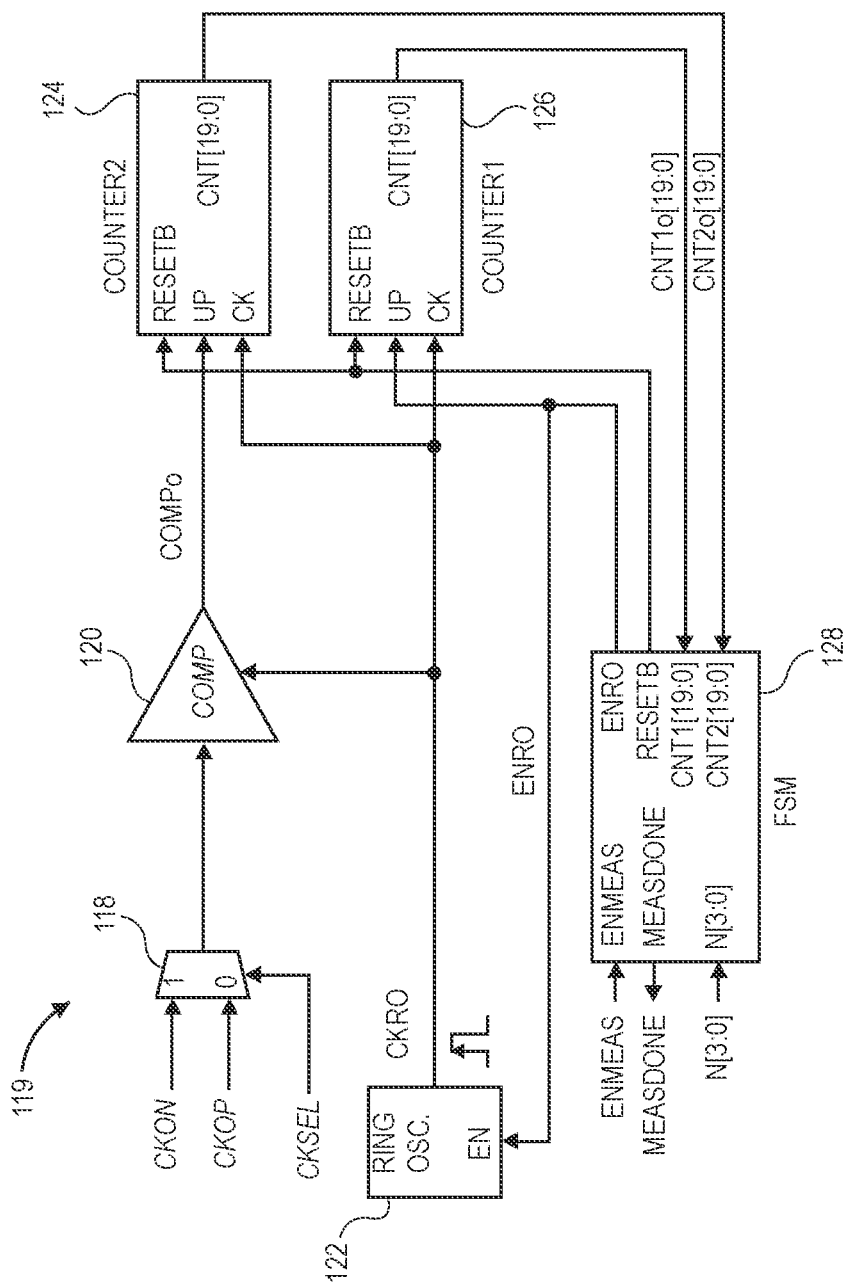
Figure 2:
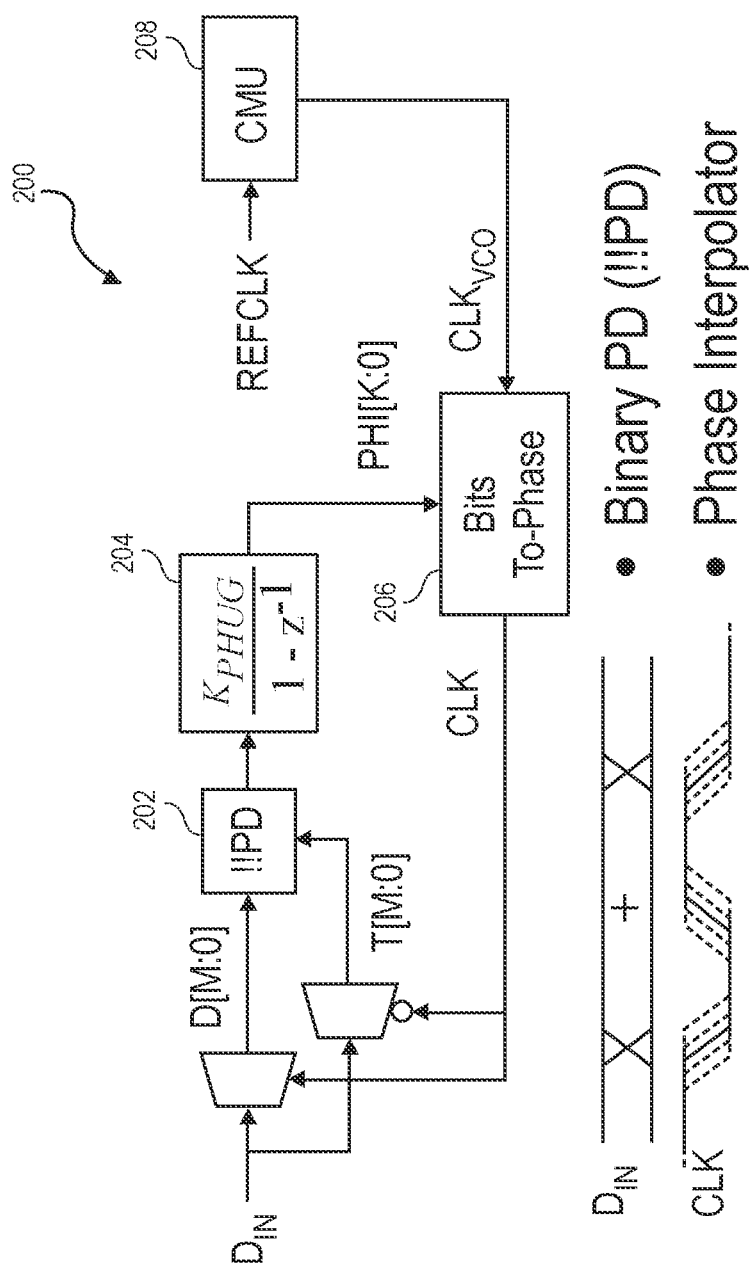
FIG. 2 illustrates a schematic block diagram of a delay locked loop (DLL)-based clock and data recovery (CDR) circuit in which the circuit shown in FIGS. 1A AND 1B may be implemented.

Current integration is a power efficient technique for realizing bit-to-phase conversion, or phase interpolation. FIGS. 1A AND 1B illustrates a circuit 100 for implementing a current integrating phase interpolator (CIPI) having a programmable bias current in accordance with features of embodiments described herein, which may function as a building block in a wireline deserializer 200, as shown in FIG. 2, for use in a transceiver device, for example. The wireline deserializer 200 may include a phase detector 202, a loop filter 204, a bit-to-phase converter 206, which may be implemented using circuit 100 (FIGS. 1A AND 1B), and a clock multiplier unit (CMU) 208. It will be recognized that phase interpolators that implement a full 2n phase shift generally require some slew rate control.

Referring again to FIGS. 1A AND 1B, in a first stage 101 of the circuit 100, a pseudo-differential square wave signal, such as represented by a waveform 102, is applied as a clock signal at each of CKIP and CKIN, which serve as inputs to current starved (or current switching) inverters INV0 and INV1. A PMOS current source 106a supplies a programmable bias current $I_B$, and NMOS current source 106b sinks current $I_B$. When CKIP is LOW, INV0 steers current $I_B$ from VDD to output OUTN. The signal at output OUTN slews with a slope of $I_B/C_L$ toward VDD, where $C_L$ is the dominant capacitance on OUTN. Concurrently, CKIN is HIGH such that signal at output OUTP slews toward VSS at the same rate ($I_B/C_L$). The desired shape of the signal at output OUTN is a sawtooth, as represented by a waveform 108. Maintaining a constant current over an entire swing range VSWING requires that the both the PMOS current source 106a and the NMOS current source 106b remain in saturation. If 150 mV of margin is allocated at both VDD and VSS with a 1V power supply, VSWING should be less than 700 mV. It will be assumed for the sake of example that a common-mode voltage VCM1 on output OUTN equal to VDD/2.

The outputs OUTN and OUTP constitute outputs of the first stage 101 of circuit 100 and are respectively applied to pick-off amplifiers INV2 and INV3, which are implemented as AC-coupled inverters with resistive feedback. The inverters INV2 and INV3 convert a sawtooth wave (e.g., waveform 108) applied at inputs IN and IP into a square or rectangular wave at outputs CKOP and CKON. The lowest level of jitter of the signal on clock output CKOP may be achieved by maximizing the slope of the sawtooth wave into INV2. An optimal slope maximizes VSWING while maintaining the PMOS current source 106a and NMOS current source 106b in saturation; in general, voltage swing trades phase noise for headroom. In certain embodiments, in a case in which VDD is 1.0V, optimal VSWING should be greater than 0.6V for phase noise and less than 0.7V for headroom.

Capacitance CL is typically fixed. Device and parasitic interconnect capacitances are often sufficiently large such that there is no need to explicitly add capacitance to CL. Therefore, an adjustable current IB is the main mechanism for controlling VSWING. In certain embodiments, the coverage of IB should have at least a 2:1 programmable dynamic range to accommodate a frequency octave. It will be noted that, in an alternative embodiment, IB may be fixed and an adjustable value of CL may be used as the mechanism for controlling VSWING.

A circuit is needed to detect the slope of a sawtooth waveform (such as waveform 108) where the frequency of the sawtooth covers a wide range. As previously noted, signals output from the first stage 101 at outputs OUTN and OUTP drive AC coupled inverters with resistive feedback (specifically, INV2 and INV3). In accordance with certain embodiments, the resistive feedback of the inverters INV2, INV3, can be broken by opening switches SW0 and SW2 and a DC voltage from a D/A converter 116 can be used to set the common-mode voltage at the inputs IN, IP, of the inverters INV2, INV3, by closing switches SW1 and SW3. The D/A converter 116 changes the common-mode voltage by a controlled amount to alter the duty cycle distortion at the outputs of the amplifiers INV2 and INV3 (i.e., CKOP, CKON, respectively). Outputs of amplifiers INV2 and INV3, CKOP and CKON, respectively, are input to a MUX 118 of a duty cycle measurement (DCM) circuit 119.

The output of one of the amplifiers INV2, INV3, is applied to a comparator 120 via the MUX 118. A ring oscillator 122 performs a random walk through a period of a rectangular waveform to generate a signal CKRO, which is applied as a clock signal to the comparator 120 and to each of a pair of counters 124, 126. Counter 124 is configured to count a number of times a COMP signal output from the comparator 120 goes high; counter 126 is configured to count a number of times signal CKRO goes high. It will be recognized that the functions performed by the ring oscillator 122 may be performed by other elements/circuitry, including, for example, a clock device.

As will be described in greater detail below, when the common-mode of the sawtooth wave form applied to the AC-coupled inverters INV2, INV3, is set to a known voltage below VDD/2, the duty cycle is narrow 1s and wide 0s. In operation, the ring oscillator 122 performs a random walk through the period of a rectangular waveform and when the output of the comparator 120 is HIGH, a counter 124 increments. Count values CNT1[19:0] and CNT2[19:0] are provided to a finite state machine (FSM) 128. When the output of counter 126 reaches a predetermined value (e.g., 1024), the output of counter 124 is an estimate of the duty cycle for a low threshold.

Similarly, when the common-mode voltage of the sawtooth waveform applied to the AC-coupled inverters is set to a known voltage above VDD/2, the duty cycle is wide 1s and narrow 0s. As previously noted, the ring oscillator 122 performs a random walk through the period of a rectangular waveform and when the output of the comparator 120 is HIGH, a counter 124 increments. Count values CNT1[19:0] and CNT2[19:0] are provided to a finite state machine (FSM) 128. When the output of counter 126 reaches a predetermined value (e.g., 1024), the output of counter 124 is an estimate of the duty cycle for a high threshold.

In accordance with features of embodiments described in greater detail below, the bias current, IB, is adjusted for the smallest amount that results in the difference between the output of the counter 124 for the low threshold and the output of the counter 124 for the high threshold being less than a target integer threshold.

Figure 3:
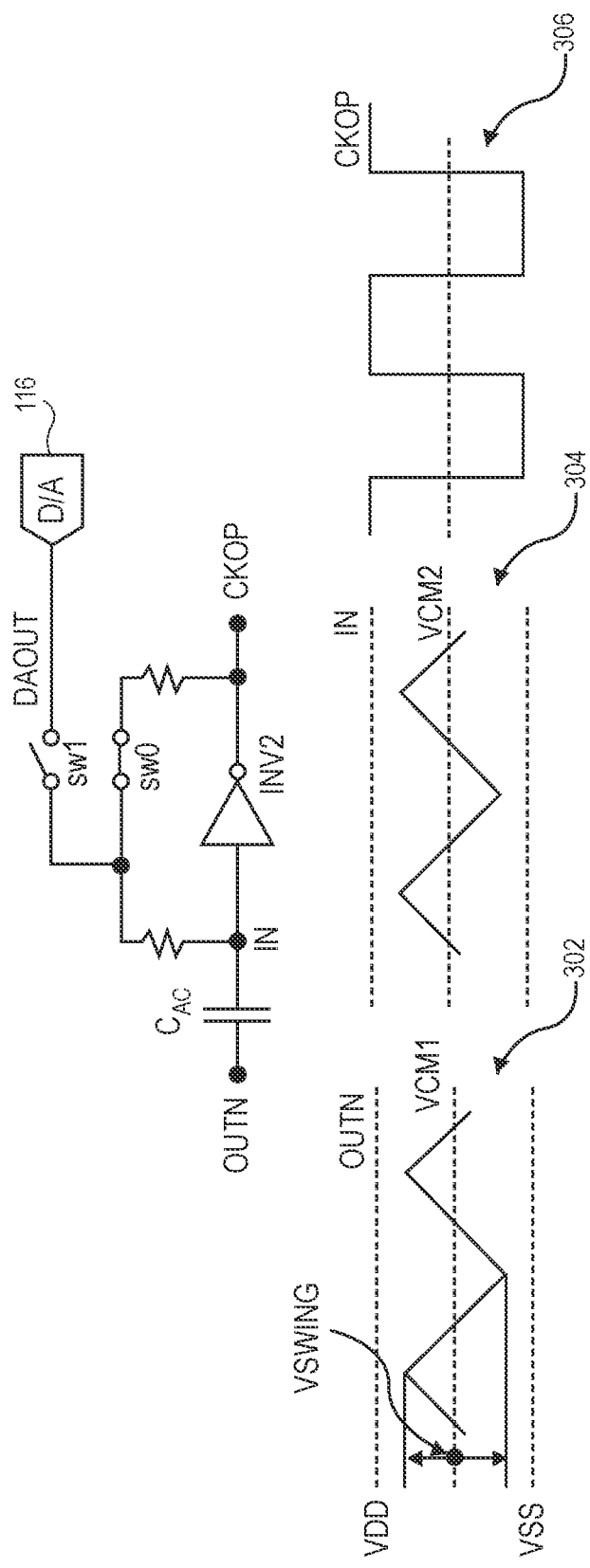
FIG. 3 illustrates operation of an embodiment of an alternating current (AC)-coupled inverter for use in implementing the circuit shown in FIGS. 1A AND 1B.

FIG. 3 illustrates a normal mode of operation of AC-coupled inverter INV2. As shown in FIG. 3, the sawtooth waveform on output OUTN has a common-mode volte of VCM1 (graph 302). In one embodiment, VCM1 is set to VDD/2 such that the signal at the output OUTN swings symmetrically to VDD and VSS. AC-coupled inverter INV2 decouples the common-mode voltage on output OUTN (VCM1) from the common-mode voltage at input IN (VCM2) (graph 304). In the normal mode of operation, switch sw0 is closed, enabling resistive feedback from output CKOP of inverter INV2 to input IN of inverter INV2. Through feedback, common-mode voltage VCM2 is adjusted so the duty cycle of the signal on output CKOP is close to 50/50 (graph 306).

The slew rate from the phase interpolator is related to the bias current and voltage swing by the expression:

$$\frac{I_b}{C_L} = \frac{4 \times VSWING}{T} = \frac{\Delta V}{\Delta T}.$$

In the absence of voltage clipping, the output swings its full-scale voltage in ¼ of a clock period. Slew rate can be estimated by changing the common-mode voltage at which the input signal is applied to the input IN of the inverter INV2 and then measuring the duty cycle of the resulting rectangular wave output. Duty cycle is measured for the two applied common-mode voltages VCM2, where the differences between the voltages is $\Delta V$. The measured difference in duty cycles for the two applied common-mode voltages VCM2, is used to compute $\Delta T$.

In the absence of voltage clipping, the output swings its full-scale voltage in $¼^{th}$ of a clock period. Slew rate can be estimated by changing the common-mode voltage at which the signal IN is applied to the inverter and then measuring the duty cycle of the resulting rectangular wave output. Duty cycle is measured for the two applied common-mode voltages where the differences between these voltages is $\Delta V$. The measured difference in duty cycles for the two applied common-mode voltages is used to compute $\Delta T$.

An AC-coupled inverter, such as inverters INV2, INV3, can be made to behave like a comparator pre-amplifier with a programmable threshold voltage so long as the signal input to the inverter is a periodic waveform with finite slope (e.g., sine wave or triangular wave). In accordance with features of embodiments described herein, resistive feedback around the AC-coupled inverter INV2 is disabled by opening switch sw0 and the switch sw1 is closed to enable a DC voltage to be forced by D/A converter 116.

Figure 4:
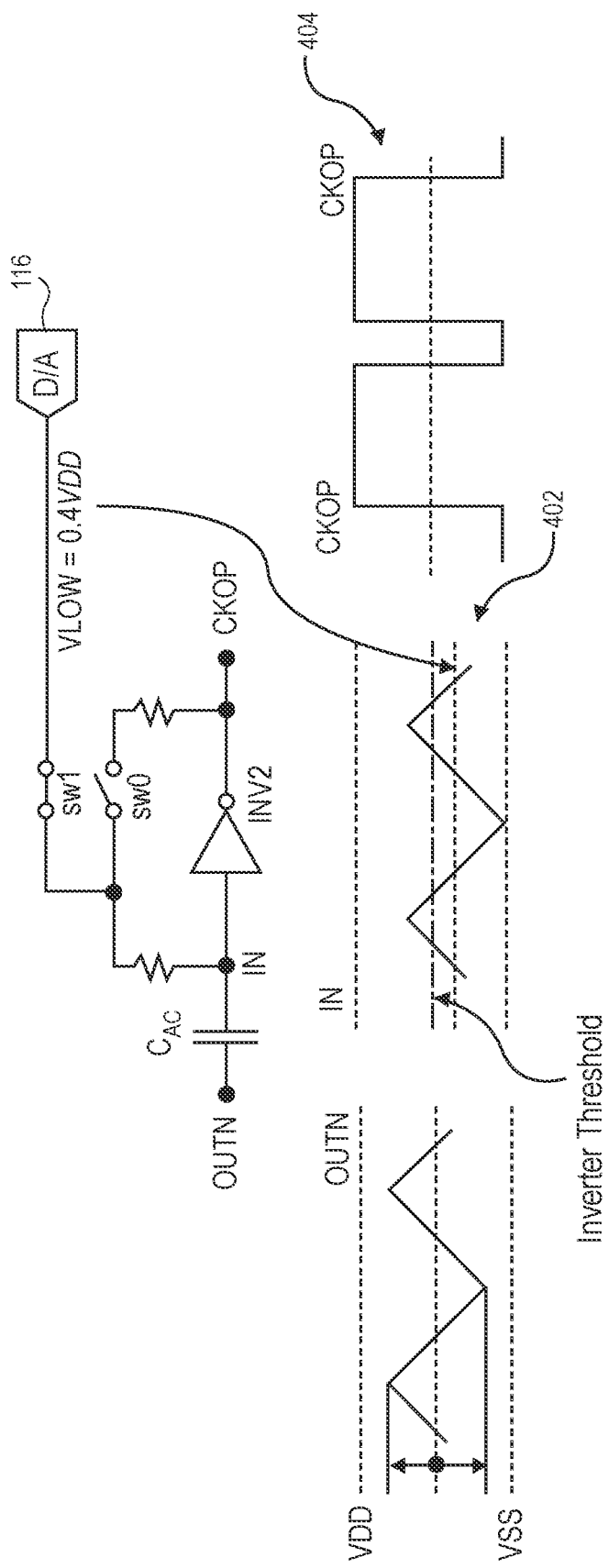
FIG. 4 illustrates operation of the AC-coupled inverter of FIG. 3 with common-mode level shift toward VSS in accordance with embodiments descried herein.

In accordance with features of embodiments described herein, slew rate may be calibrated as follows. Altering common mode voltage VCM2 shifts the DC voltage on input IN relative to the threshold of the inverter INV2. FIG. 4 illustrates operation of AC-coupled inverter INV2 with a common mode level shift toward VSS. In the example illustrated in FIG. 4, VCM2 is set to VLOW (e.g., 0.4 VDD) and the voltage threshold of the inverter INV2 is assumed to be 0.5 VDD. If a perfect sawtooth waveform with a swing of 0.6V is applied at input IN (graph 402), the signal at output CKOP will have a duty cycle of 67/33 (graph 404).

It will be recognized by one of ordinary skill in the art that the function of the AC-coupled inverter could be performed other elements/circuits, such as a DC-coupled inverter having a programmable threshold voltage.

In an alternative example, assuming the threshold voltage of the inverter is set to 0.25 between the negative peak (0.2V) and the positive peak (0.8V) of the sawtooth wave signal input to the inverter (e.g., 0.35V), the duty cycle of a rectangular wave signal output from the inverter will be 0.75/0.25 with a swing of 0.6V. Assuming the rectangular wave signal is sampled using the DCM circuit 119 (FIGS. 1A AND 1B) for 128 sample clocks, the counter output should ideally be 96.

Figure 6:
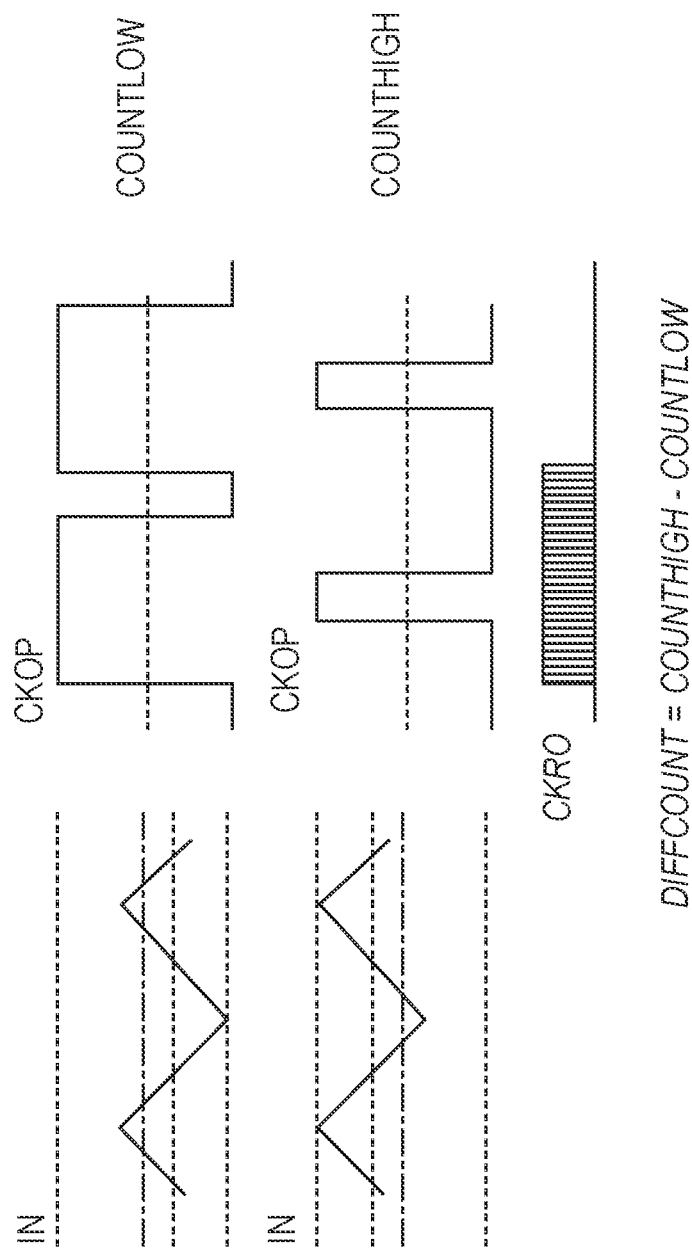
FIG. 6 illustrates graphs showing a random walk across the clock period of the circuit of FIGS. 1A AND 1B in accordance with embodiments described herein.

Referring again to FIGS. 1A AND 1B, with clock select input CKSEL of MUX 118 set to 0, the MUX 118 applies the clock signal at output CKOP to the input of the comparator 120. A stochastic technique is used to estimate the duty cycle of the signal at output CKOP. When a signal on ENMEAS transitions from LOW-to-HIGH, the signals at both RESETB and ENRO go HIGH. At this point, counters 124, 126, are both enabled, as is the ring oscillator 122. CKRO implements a random walk across the period of the CKOP as shown in FIG. 6. The output count of counter 126 increments on each rising edge of CKRO up to a threshold set by N[3:0]; the total count is $2^{3+N[3:0]}$. For example, for N=9, counter 126 counts to 8192, at which point ENRO goes LOW. Counter 124 increments only when CKOP is HIGH. As illustrated in FIG. 6, with an input duty cycle distortion (DCD) of 67/33, the expected value in COUNTLOW is 8192/3=5461 for a common-mode voltage shift of −0.1V relative to the inverter threshold.

Figure 5:
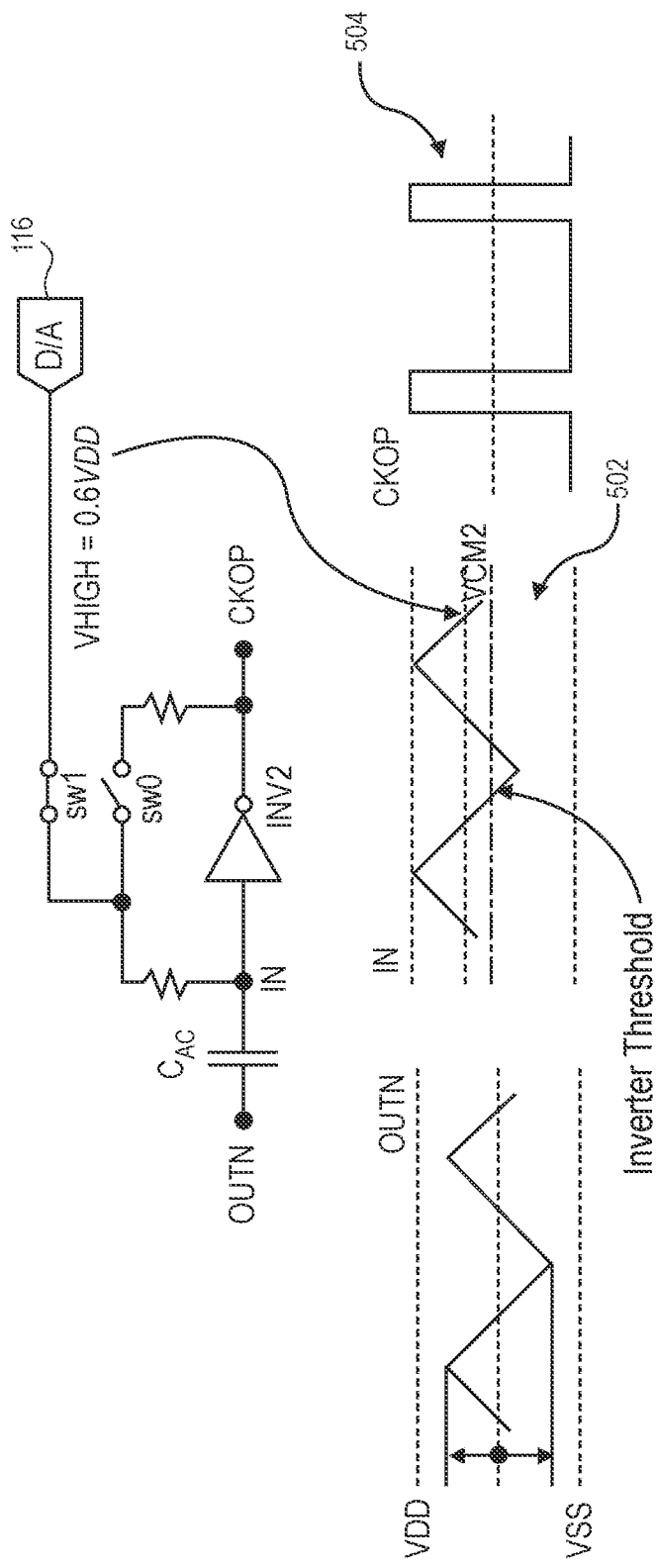
FIG. 5 illustrates operation of the AC-coupled inverter of FIG. 3 with common-mode level shift toward VDD in accordance with embodiments described herein.

Next, as illustrated in FIG. 5, VCM2 is shifted toward VDD. In the example illustrated in FIG. 5, VCM2 is set to VHIGH (e.g., 0.6 VDD) (graph 502). If the signal at input IN is a perfect sawtooth with a swing of 0.6V, the signal at output CKOP will have a duty cycle of 33/67 (graph 504).

In an alternative example, assuming the threshold voltage of the inverter is set to 0.75 between the negative peak (0.2V) and the positive peak (0.8V) of the sawtooth wave signal input to the inverter (e.g., 0.65V), the duty cycle of the rectangular wave signal output from the inverter will be 0.25/0.75 with a swing of 0.6V. Assuming the rectangular wave signal is sampled using the DCM circuit 119 (FIGS. 1A AND 1B) for 128 sample clocks, the counter output should ideally be 32.

Referring again to FIGS. 1A AND 1B, when the signal on ENMEAS transitions from LOW-to-HIGH, signals at both RESETB and ENRO go HIGH. At this point, counters 124, 126, are both enabled, as is the ring oscillator 122. As illustrated in FIG. 6, the signal at output CKRO implements a random walk across the period of the signal at output CKOP. Counter 122 increments on each rising edge of the signal at output CKRO up to a threshold set by N[3:0]; the total count is $2^{3+N[3:0]}$. For example, for N=9, counter 126 counts to 8192, at which point ENRO goes LOW. Counter 124 the signal at output CKOP is HIGH. As illustrated in FIG. 6, with an input duty cycle distortion (DCD) of 33/67, the expected value in COUNTHIGH=⅔(8192)=2731 when the common mode is shifted by 0.1 V relative to the inverter threshold.

The difference between COUNTHIGH and COUNTLOW for this example is 2731, which means the sawtooth wave spends roughly ⅓ of its period between the low threshold at VDD−0.1V and the high threshold at VDD+0.1V.

Figure 7:
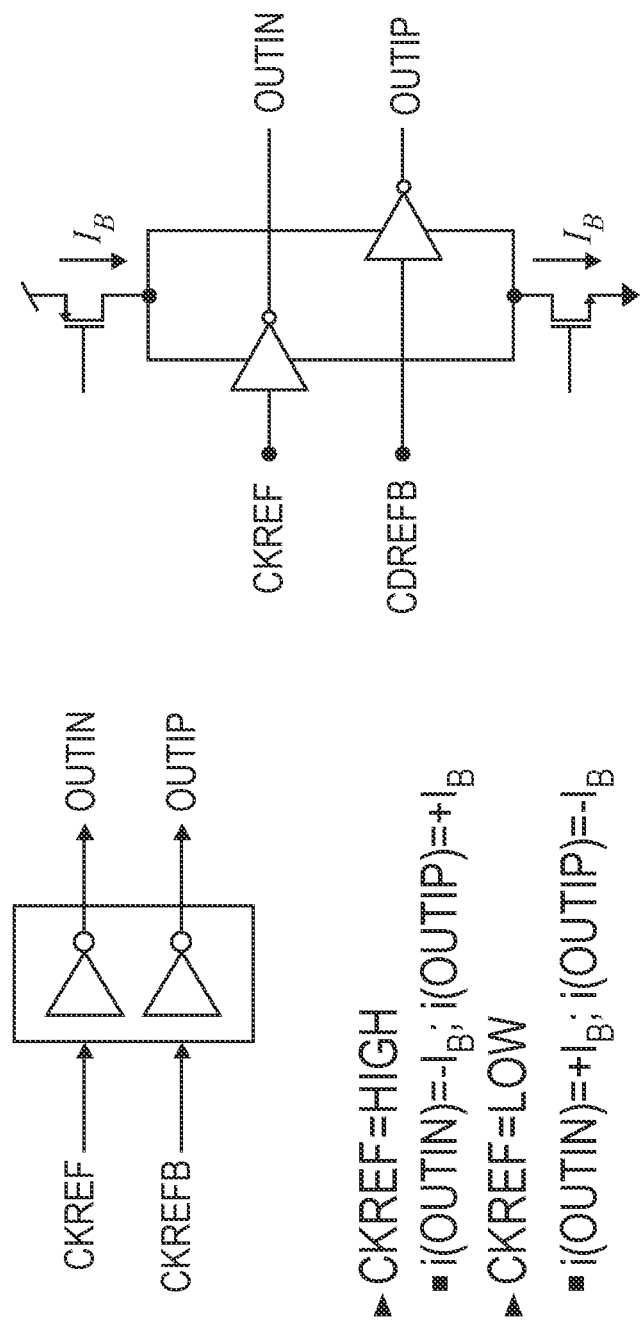
FIG. 7 illustrates operation of current switching inverters for use in implementing the circuit shown in FIGS. 1A AND 1B.

FIG. 7 illustrates operation of current switching inverters INV0, INV1. As shown in FIG. 7, when the voltage at node CKREF is HIGH, the current at node OUTIN is $-I_B$ and the current at node OUTIP is $+I_B$. Conversely, when the voltage at node CKREF is LOW, the current at node OUTIN is $+I_B$ and the current at node OUTIN is $-I_B$.

Figure 8:
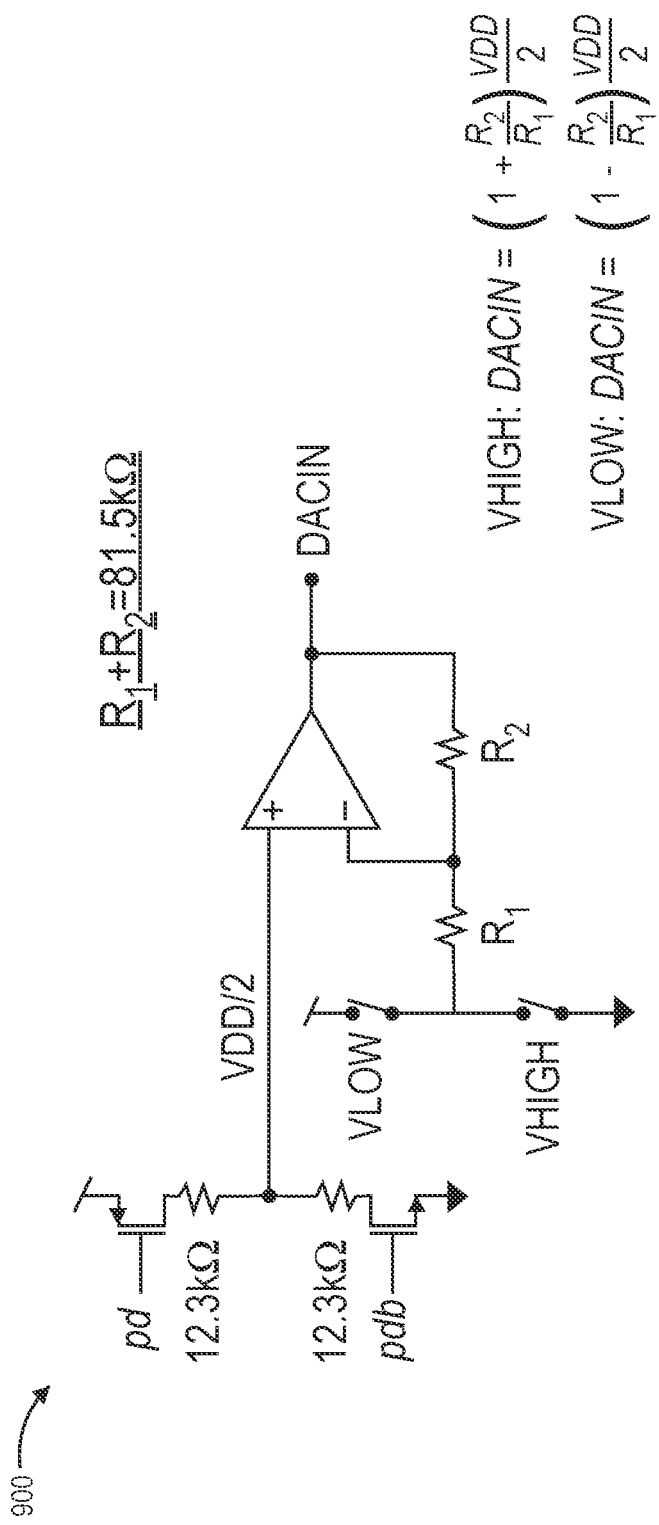
FIG. 8 is a schematic block diagram of a digital to analog (D/A) converter for setting common mode voltage thresholds in connection with the circuit of FIGS. 1A AND 1B in accordance with embodiments described herein.

One of the benefits of the architecture described herein is that a high resolution D/A converter is not required. FIG. 8 illustrates an example D/A converter 900 that may be used to implement D/A converter 116 (FIGS. 1A AND 1B). As illustrated in FIG. 8, D/A converter 900 has only a few levels and the threshold used to decide $I_B$ is set by a target for (|COUNTHIGH−COUNTLOW|). In certain embodiments, the D/A converter 900 can be self-biased with a voltage reference derived from the power supply.

In accordance with embodiments described herein, an algorithm that performs a binary search on IB is used to calibrate the slew rate, where the control word is an unsigned integer ibslewfs[5:0]. Other search techniques, such as sweeping $I_B$ from low-to-high or high-to-low may be implemented as alternatives to a binary search.

In one embodiment, the minimum targeted VSWING is 0.6 VDD to balance headroom with phase noise. A D/A converter whose reference is the supply sets VLOW=0.4 VDD and VHIGH=0.6 VDD. The number of ring oscillator periods per measurement is $M=2^{3+N[3:0]}$. When VSWING is 0.6 VDD, the difference between COUNTHIGH and COUNTLOW should be COUNTTHRESH=M/3. If the swing on output OUTN is too low, |COUNTHIGH−COUNTLOW|>COUNTTHRESH. Offsets between the D/A output voltages and the inverter threshold will cause COUNTLOW and COUNTHIGH to individually deviate from M/3. However, their difference removes this mismatch. Example pseudo-code for implementing an embodiment of the algorithm is as follows:

```
lbslewfs=b'000000;
ENMEAS=b'0;
do bitindex=0 to 5 // Starts from MSB to LSB.
   Set lbslewfs[5-bitindex]=b'1;
   DAOUT=VLOW;
   ENSLEWMEAS=b'1;
   while (~MEASDONE);
   COUNTLOW=CNT2o;
   ENSLEWMEAS=b'0;
   DAOUT=VHIGH;
   ENSLEWMEAS=b'1;
   while (~MEASDONE);
   COUNTHIGH=CNT2o;
   if((COUNTHIGH−COUNTLOW)<COUNT-
      THRESH) // signal is too large
      Set lbslewfs[5-bitindex]=b'0;
Enddo
// Guarantee minimum swing
DAOUT=VLOW;
ENSLEWMEAS=b'1;
while (~MEASDONE);
COUNTLOW=CNT2o;
ENSLEWMEAS=b'0;
DAOUT=VHIGH;
ENSLEWMEAS=b'1;
while (~MEASDONE);
COUNTHIGH=CNT2o;
if(COUNTHIGH−COUNTLOW>COUNTTHRESH) //
   signal is too small
   lbslewfs+=1;
```

Example Systems and Devices

The circuit 100 may be implemented in any electronic device or system where distribution measurement of slew rate in a CIPI may be desirable. Some examples of such devices/systems are shown in FIGS. 10-12.

Figure 9:
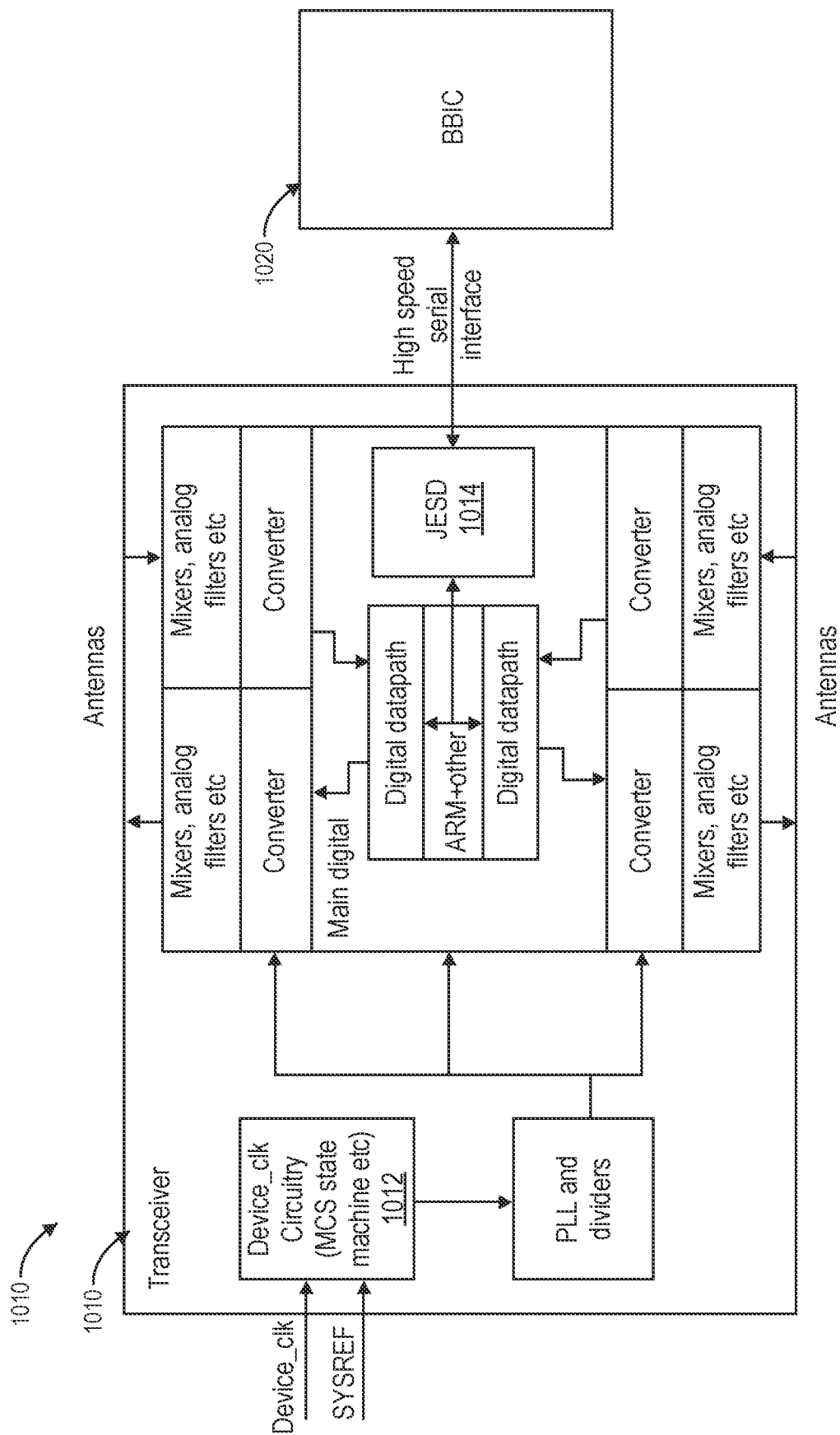
FIG. 9 provides a schematic illustration of an electronic device in which slew rate measurement in a CIPI may be implemented, according to some embodiments of the present disclosure.

In some embodiments, the circuit 100 may be implemented in a radio system. Radio systems are systems that transmit and receive signals in the form of electromagnetic waves in the RF range of approximately 3 kilohertz (kHz) to 300 gigahertz (GHz). Radio systems may be used in a myriad of different applications, such as airplane, automotive and industrial radar, cellular technology, Wi-Fi and other short-range communication technologies, and military applications. One example is shown in FIG. 9, providing a schematic illustration of an electronic device 1000 that includes an RF transceiver 1010 and a baseband IC (BBIC) 1020, coupled to the RF transceiver 1010 using, e.g., a high-speed serial interface supported by JESD. In some embodiments, portions of the circuit 100 may be implemented in a device clock circuitry component 1012, while other portions of the circuit 100 may be implemented in the JESD 1014. In other embodiments, various portions of the circuit 100 may be included in other portions of the electronic device 1000.

Figure 10:
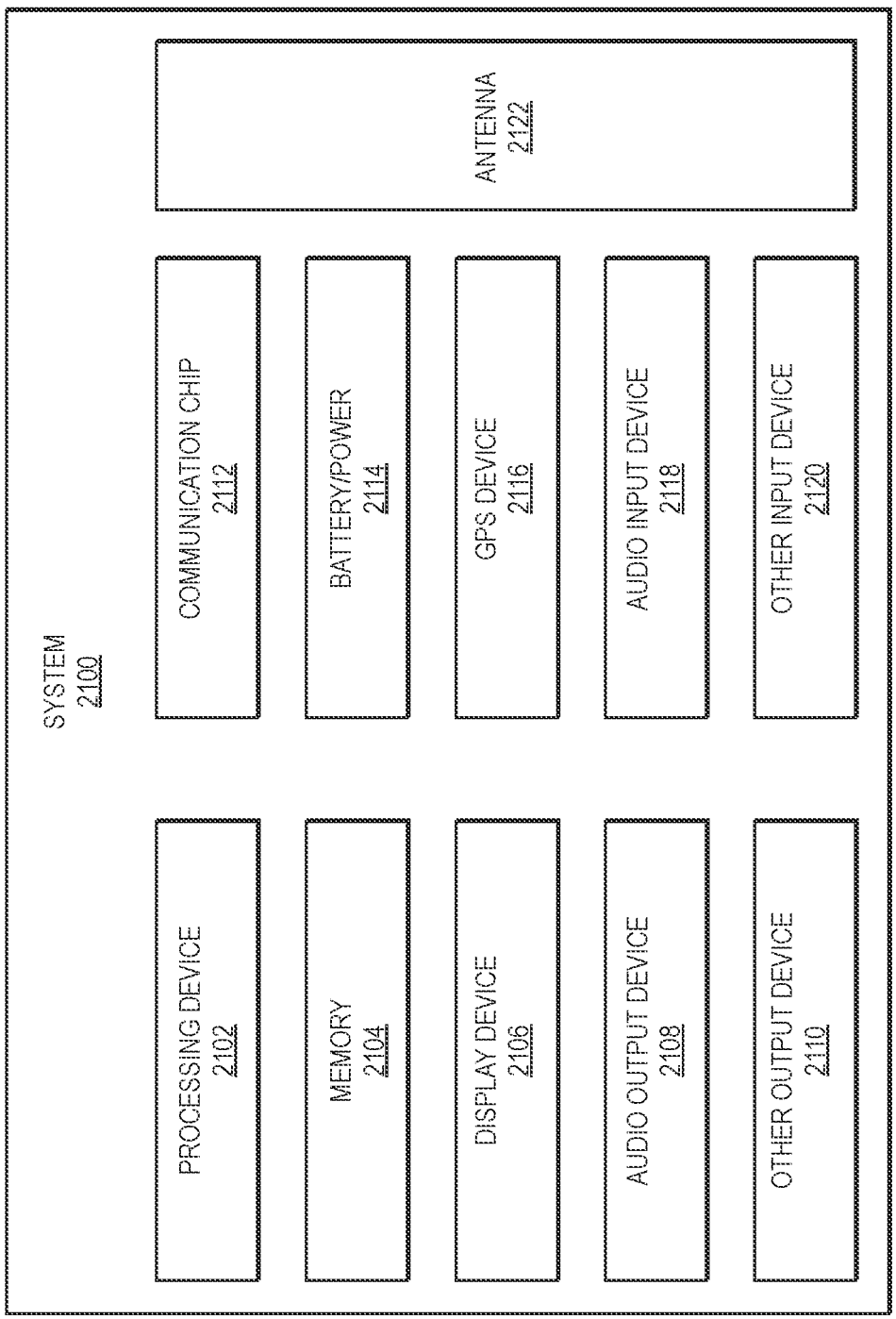
FIG. 10 is a block diagram of an example system that may include one or more systems configured to provide slew rate measurement in a CIPI, according to some embodiments of the present disclosure.
Figure 11:
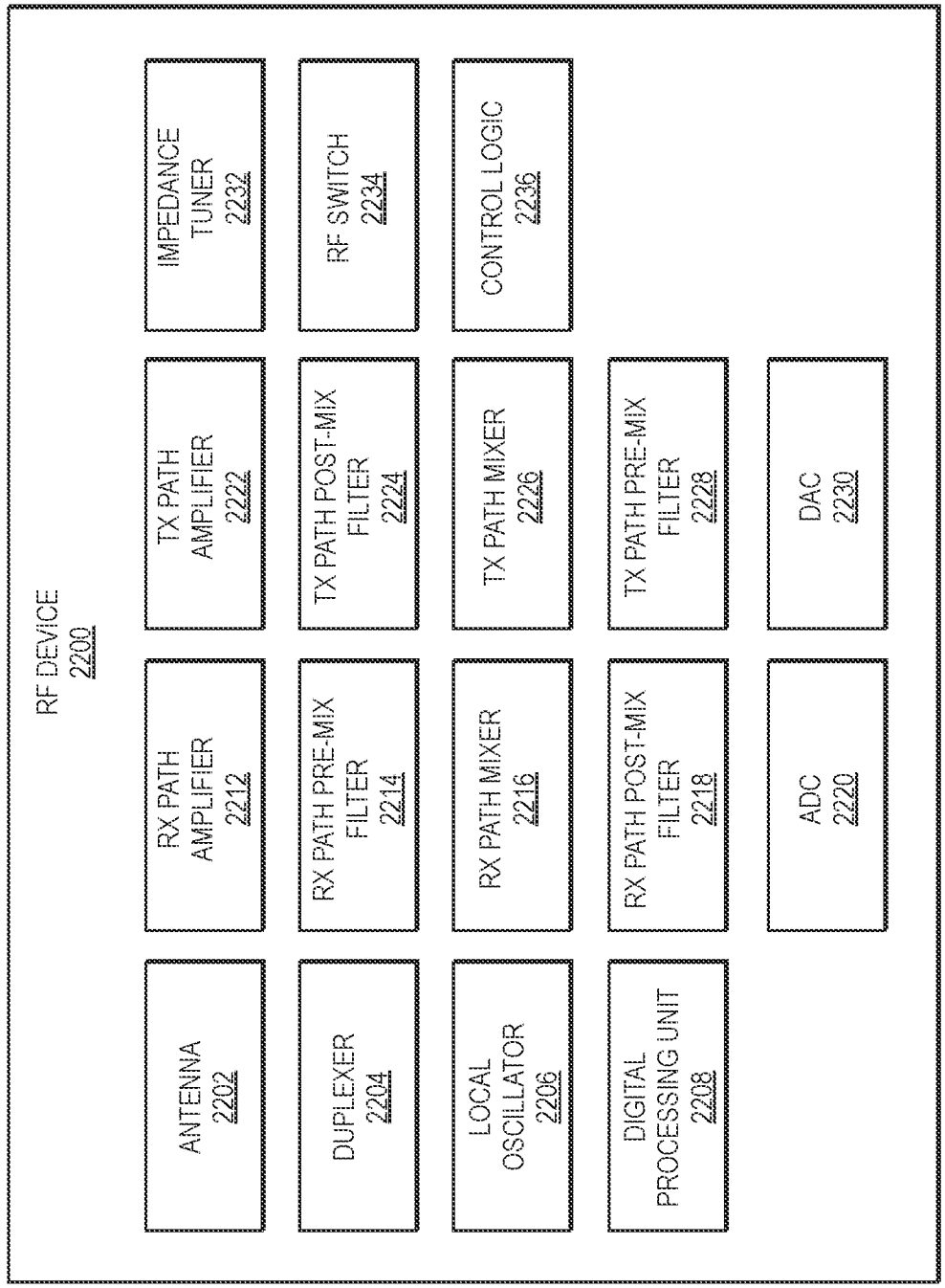
FIG. 11 is a block diagram of an example radio frequency (RF) device that may include one or more systems configured to provide slew rate measurement in a CIPI, according to some embodiments of the present disclosure.

FIG. 10 is a block diagram of an example system 2100 that may include one or more systems configured to measure slew rate in a CIPI, in accordance with any of the embodiments disclosed herein. For example, any suitable ones of the components of the system 2100 may include one or more of the circuit 100 and/or the device 1000 as disclosed herein. A number of components are illustrated in FIG. 10 as included in the system 2100, but any one or more of these components may be omitted or duplicated, as suitable for the application. In some embodiments, some or all of the components included in the system 2100 may be attached to one or more motherboards. In some embodiments, some or all of these components are fabricated onto a single system-on-a-chip (SoC) die.

Additionally, in various embodiments, the system 2100 may not include one or more of the components illustrated in FIG. 10, but the system 2100 may include interface circuitry for coupling to the one or more components. For example, the system 2100 may not include a display device 2106, but may include display device interface circuitry (e.g., a connector and driver circuitry) to which a display device 2106 may be coupled. In another set of examples, the system 2100 may not include an audio input device 2118 or an audio output device 2108, but may include audio input or output device interface circuitry (e.g., connectors and supporting circuitry) to which an audio input device 2118 or audio output device 2108 may be coupled.

The system 2100 may include a processing device 2102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The system 2100 may include a memory 2104, which may itself include one or more memory devices such as volatile memory (e.g., dynamic RAM (DRAM)), nonvolatile memory (e.g., read-only memory (ROM)), flash memory, solid state memory, and/or a hard drive. In some embodiments, the memory 2104 may include memory that shares a die with the processing device 2102. This memory may be used as cache memory and may include embedded DRAM (eDRAM) or spin transfer torque magnetic RAM (STT-MRAM).

In some embodiments, the system 2100 may include a communication chip 2112 (e.g., one or more communication chips). For example, the communication chip 2112 may be configured for managing wireless communications for the transfer of data to and from the system 2100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2112 may operate in accordance with other wireless protocols in other embodiments. The system 2100 may include an antenna 2122 to facilitate wireless communications and/or to receive other wireless communications (such as AM or FM radio transmissions).

In some embodiments, the communication chip 2112 may manage wired communications, such as electrical, optical, or any other suitable communication protocols (e.g., the Ethernet). As noted above, the communication chip 2112 may include multiple communication chips. For instance, a first communication chip 2112 may be dedicated to shorter-range wireless communications such as Wi-Fi or Bluetooth, and a second communication chip 2112 may be dedicated to longer-range wireless communications such as global positioning system (GPS), EDGE, GPRS, CDMA, WiMAX, LTE, EV-DO, or others. In some embodiments, a first communication chip 2112 may be dedicated to wireless communications, and a second communication chip 2112 may be dedicated to wired communications.

The system 2100 may include battery/power circuitry 2114. The battery/power circuitry 2114 may include one or more energy storage devices (e.g., batteries or capacitors) and/or circuitry for coupling components of the system 2100 to an energy source separate from the system 2100 (e.g., AC line power).

The system 2100 may include a display device 2106 (or corresponding interface circuitry, as discussed above). The display device 2106 may include any visual indicators, such as a heads-up display, a computer monitor, a projector, a touchscreen display, a liquid crystal display (LCD), a light-emitting diode display, or a flat panel display.

The system 2100 may include an audio output device 2108 (or corresponding interface circuitry, as discussed above). The audio output device 2108 may include any device that generates an audible indicator, such as speakers, headsets, or earbuds.

The system 2100 may include an audio input device 2118 (or corresponding interface circuitry, as discussed above). The audio input device 2118 may include any device that generates a signal representative of a sound, such as microphones, microphone arrays, or digital instruments (e.g., instruments having a musical instrument digital interface (MIDI) output).

The system 2100 may include a GPS device 2116 (or corresponding interface circuitry, as discussed above). The GPS device 2116 may be in communication with a satellite-based system and may receive a location of the system 2100, as known in the art.

The system 2100 may include another output device 2110 (or corresponding interface circuitry, as discussed above). Examples of the other output device 2110 may include an audio codec, a video codec, a printer, a wired or wireless transmitter for providing information to other devices, or an additional storage device.

The system 2100 may include another input device 2120 (or corresponding interface circuitry, as discussed above). Examples of the other input device 2120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The system 2100 may have any desired form factor, such as a handheld or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server device or other networked computing component, a printer, a scanner, a monitor, a set-top box, an entertainment control unit, a vehicle control unit, a digital camera, a digital video recorder, or a wearable electrical device. In some embodiments, the system 2100 may be any other electronic device that processes data.

FIG. 11 is a block diagram of an example RF device 2200 that may include one or more components with one or more systems configured to provide slew rate measurement in a CIPI in accordance with any of the embodiments disclosed herein. For example, any suitable ones of the components of the RF device 2200 may include a die including at least one system, or a portion thereof, configured to provide slew rate measurement in a CIPI in accordance with any of the embodiments disclosed herein. In some embodiments, the RF device 2200 may be included within any components of the system 2100 as described with reference to FIG. 10, or may be coupled to any of the components of the system 2100, e.g., be coupled to the memory 2104 and/or to the processing device 2102 of the system 2100. In still other embodiments, the RF device 2200 may further include any of the components described with reference to FIG. 10, such as, but not limited to, the battery/power circuit 2114, the memory 2104, and various input and output devices as shown in FIG. 10.

In general, the RF device 2200 may be any device or system that may support wireless transmission and/or reception of signals in the form of electromagnetic waves in the RF range of approximately 3 kiloHertz (kHz) to 300 gigaHertz (GHz). In some embodiments, the RF device 2200 may be used for wireless communications, e.g., in a base station (BS) or a user equipment (UE) device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

A number of components are illustrated in FIG. 11 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all of the components included in the RF device 2200 may be attached to one or more motherboards. In some embodiments, some or all of these components are fabricated on a single die, e.g., on a single SoC die.

Additionally, in various embodiments, the RF device 2200 may not include one or more of the components illustrated in FIG. 11, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 11, the RF device 2200 may include an antenna 2202, a duplexer 2204, a local oscillator 2206, a digital processing unit 2208. As also shown in FIG. 11, the RF device 2200 may include an RX path that may include an RX path amplifier 2212, an RX path pre-mix filter 2214, a RX path mixer 2216, an RX path post-mix filter 2218, and an ADC 2220. As further shown in FIG. 11, the RF device 2200 may include a TX path that may include a TX path amplifier 2222, a TX path post-mix filter 2224, a TX path mixer 2226, a TX path pre-mix filter 2228, and a DAC 2230. Still further, the RF device 2200 may further include an impedance tuner 2232, an RF switch 2234, and control logic 2236. In various embodiments, the RF device 2200 may include multiple instances of any of the components shown in FIG. 11. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 11) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 11 as control logic 2236, e.g., an RF FE control interface. In some embodiments, the control logic 2236 may be configured to control at least portions of operating any of the systems configured to provide slew rate measurement in a CIPI, as described herein, within any components of the RF device 2200. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. In some embodiments, the digital processing unit 2208 may be implemented as the processing device 2102 shown in FIG. 10, descriptions of which are provided above (when used as the digital processing unit 2208, the processing device 2102 may, but does not have to, implement any of the systems configured to provide slew rate measurement in a CIPI as described herein). The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 11, in some embodiments, the RF device 2200 may further include a memory device, e.g., the memory device 2104 as described with reference to FIG. 10, configured to cooperate with the digital processing unit 2208. When used within, or coupled to, the RF device 2200, the memory device 2104 may, but does not have to, implement any of the systems configured to provide slew rate measurement in a CIPI as described herein.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 11, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, similar to the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Similar to the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Similar to the RX path mixer 2216, the TX path mixer 2226 may include a pair of TX path mixers, for in-phase and quadrature component mixing. Similar to the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may be a power amplifier (PA), configured to amplify the upconverted RF signal before providing it to the antenna 2202 for transmission.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 11, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 11 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable PLL, configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path. One or more systems configured to provide slew rate measurement in a CIPI, described herein, may be included to provide slew rate measurement in a CIPI for operation of one of more of these components.

Example Data Processing System

FIG. 12 provides a block diagram illustrating an example data processing system 2300 that may be configured to control operation of one or more systems configured to provide slew rate measurement in a CIPI, according to some embodiments of the present disclosure. For example, the data processing system 2300 may be configured to implement or control portions of the circuit 100 and/or the device 1000 as described herein. In some embodiments, the data processing system 2300 may be configured to implement the control logic 2236, shown in FIG. 11.

As shown in FIG. 12, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to providing slew rate measurement in a CIPI, as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific IC (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or nonvolatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements of circuit 100 and/or the device 1000, can also include suitable interfaces for receiving, transmitting, and/or otherwise communicating data or information in a network environment so that they can communicate with, e.g., the data processing system 2300.

In certain example implementations, mechanisms for realizing slew rate measurement in a CIPI as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 12, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 12, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 12, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 12) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 12 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

EXAMPLES

Example 1 is an apparatus including a current integrating phase interpolator core having a programmable bias current; an AC-coupled inverter circuit coupled to an output of the current integrating phase interpolator core for receiving a signal comprising a periodic sawtooth waveform therefrom; a digital-to-analog (D/A) converter for setting an input common mode voltage of the AC-coupled inverter circuit; a duty cycle measurement (DCM) circuit for measuring a duty cycle distortion (DCD) of a clock signal output from the AC-coupled inverter circuit; and a circuit for computing a difference in the DCD of the clock signal when the input common mode voltage of the inverter circuit is set to a high voltage and when the input common mode voltage of the inverter circuit is set to a low voltage.

In Example 2, the apparatus of Example 1 may further include a circuit for comparing the computed difference to a threshold value and adjusting a level of the programmable bias current based on the comparison.

In Example 3, the apparatus of any of Examples 1-2 may further include, if the computed difference is greater than the threshold value, the level of the programmable bias current is increased.

In Example 4, the apparatus of any of Examples 1-3 may further include, if the computed difference is less than the threshold value, the level of the programmable bias current is decreased.

In Example 5, the apparatus of any of Examples 1-4 may further include the inverter circuit further comprising an inverter having an input and an output; and a resistor coupled between the input and the output via a first switch for providing direct current (DC) feedback from the output to the input when the first switch is closed.

In Example 6, the apparatus of any of Examples 1-5 may further include the inverter circuit further comprising a second switch for selectively coupling the D/A converter to the input of the inverter when the first switch is open and the second switch is closed.

In Example 7, the apparatus of any of Examples 1-6 may further include the DCM circuit comprising a clock circuit for performing a random walk across a sampling period of the clock signal output from the inverter circuit.

In Example 8, the apparatus of any of Examples 1-7 may further include the DCM circuit comprising a comparator having an input comprising a buffered version of the clock signal output from the inverter circuit.

In Example 9, the apparatus of any of Examples 1-8 may further include the clock circuit generating a clock signal for the comparator.

In Example 10, the apparatus of any of Examples 1-9 may further include DCM circuit comprising a counter that increments when an output of the comparator is high.

In Example 11, the apparatus of any of Examples 1-10 may further include the DCM circuit comprising a counter that increments on every sampling edge of the clock signal generated by the clock circuit.

In Example 12, the apparatus of any of Examples 1-11 may further include the current integrating phase interpolator core comprising current switching inverters.

Example 13 is an apparatus including a current integrating phase interpolator core having a programmable bias current; an inverter circuit coupled to an output of the current integrating phase interpolator core for receiving a signal comprising a periodic sawtooth waveform therefrom, the inverter circuit further comprising an inverter having an input and an output and a switch for selectively coupling a digital-to-analog (D/A) converter to the input of the inverter for setting an input common mode voltage of the inverter circuit to one of a high voltage and a low voltage; a duty cycle measurement (DCM) circuit for measuring a duty cycle distortion (DCD) of a clock signal output from the inverter circuit; and a circuit for computing a difference in the DCD of the clock signal when the input common mode voltage of the inverter circuit is set to a high voltage and when the input common mode voltage of the inverter circuit is set to a low voltage and for comparing the computed difference to a threshold value and adjusting a level of the programmable bias current based on the comparison.

In Example 14, the apparatus of Example 13 may further include, if the computed difference is greater than the threshold value, increasing the level of the programmable bias current.

In Example 15, the apparatus of any of Examples 13-14 may further include, if the computed difference is less than the threshold value, decreasing the level of the programmable bias current.

In Example 16, the apparatus of any of Examples 13-15 may further include a clock circuit for performing a random walk across a sampling period of the clock signal output from the inverter circuit; and a comparator having an input comprising a buffered version of the clock signal output from the inverter circuit.

In Example 17, the apparatus of any of Examples 13-16 may further include the clock circuit generating a clock signal for the comparator.

In Example 18, the apparatus of any of Examples 13-17 may further include the DCM circuit comprising a first counter that increments when an output of the comparator is high; and a second counter that increments on every sampling edge of the clock signal generated by the clock circuit.

Example 19 is a method of measuring a slew rate in a current integrating phase interpolator (CIPI) having a programmable bias current comprising setting a common-threshold voltage of an inverter to a low level; measuring a first duty cycle distortion (DCD) of a signal at an output of the inverter corresponding to the low level common-threshold voltage; setting the common-threshold voltage of the AC coupled inverter to a high level; measuring a second DCD of the signal at the output of the inverter corresponding to the high level common-threshold voltage; comparing a difference between the first and second DCDs to a threshold value; and adjusting a programmable bias current of the CIPI based on a result of the comparing.

In Example 20, the method of Example 19 may further include the adjusting comprising increasing a level of the programmable bias current if the difference is greater than the threshold value and decreasing the level of the programmable bias current if the difference is less than the threshold value.

Variations and Implementations

While embodiments of the present disclosure were described above with references to exemplary implementations as shown herein, a person skilled in the art will realize that the various teachings described above are applicable to a large variety of other implementations.

In the discussions of the embodiments above, components of a system, such as e.g. combiners/adders, flip-flops, multiplexers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to providing slew rate measurement in a CIPI.

Parts of various systems for implementing slew rate measurement in a CIPI as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In some embodiments, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In some embodiments, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

All of the specifications, dimensions, and relationships outlined herein (e.g., the number of components of the various devices and systems for providing slew rate measurement in a CIPI, or portions of such devices and systems, shown in the present drawings, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the present drawings may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the present figures and its teachings are readily scalable and can accommodate a large number of components, as well as more complicated or sophisticated arrangements and configurations. Accordingly, the examples provided should not limit the scope or inhibit the broad teachings of the electrical circuits as potentially applied to a myriad of other architectures.

Furthermore, functions related to providing slew rate measurement in a CIPI as proposed herein illustrate only some of the possible functions that may be executed by, or within, system illustrated in the present figures. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Note that all optional features of the apparatus described above may also be implemented with respect to the method or process described herein and specifics in the examples may be used anywhere in one or more embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

What is claimed is:

1. An apparatus comprising:
   a current integrating phase interpolator core having a programmable bias current;
   an inverter circuit coupled to an output of the current integrating phase interpolator core for receiving a signal comprising a periodic sawtooth waveform therefrom;
   a digital-to-analog (D/A) converter for setting an input common mode voltage of the inverter circuit;
   a duty cycle measurement (DCM) circuit for measuring a duty cycle distortion (DCD) of a clock signal output from the inverter circuit; and
   a circuit for computing a difference between a first state of the DCD of the clock signal corresponding to the input common mode voltage of the inverter circuit being set to a high voltage and a second state of the DCD of the clock signal corresponding to the input common mode voltage of the inverter circuit being set to a low voltage.

2. The apparatus of claim 1 further comprising a circuit for comparing the computed difference to a threshold value and adjusting a level of the programmable bias current based on the comparison.

3. The apparatus of claim 2, wherein if the computed difference is greater than the threshold value, the level of the programmable bias current is increased.

4. The apparatus of claim 2, wherein if the computed difference is less than the threshold value, the level of the programmable bias current is decreased.

5. The apparatus of claim 1, wherein the inverter circuit further comprises:
   an inverter having an input and an output; and
   a resistor coupled between the input and the output via a first switch for providing direct current (DC) feedback from the output to the input when the first switch is closed.

6. The apparatus of claim 5, wherein the inverter circuit further comprises a second switch for selectively coupling the D/A converter to the input of the inverter when the first switch is open and the second switch is closed.

7. The apparatus of claim 1, wherein the DCM circuit comprises clock circuitry for performing a random walk across a sampling period of the clock signal output from the inverter circuit.

8. The apparatus of claim 1, wherein the inverter circuit comprises at least one AC-coupled inverter.

9. The apparatus of claim 1, wherein the inverter circuit comprises at least one DC-coupled inverter including a programmable threshold voltage.

10. The apparatus of claim 1, wherein the DCM circuit comprises a clock circuit for performing a random walk across a sampling period of the clock signal output from the inverter circuit.

11. The apparatus of claim 1, wherein the DCM circuit comprises:
    a counter that increments when an output of the comparator is high; and
    a counter that increments on every sampling edge of the clock signal generated by the clock circuitry.

12. The apparatus of claim 1, wherein the current integrating phase interpolator core comprises current switching inverters.

13. An apparatus comprising:
    a current integrating phase interpolator core having a programmable bias current;
    an inverter circuit coupled to an output of the current integrating phase interpolator core for receiving a signal comprising a periodic sawtooth waveform therefrom, the inverter circuit further comprising at least one of an AC-coupled inverter and a DC-coupled inverter including a programmable threshold voltage;
    a duty cycle measurement (DCM) circuit for measuring a duty cycle distortion (DCD) of a clock signal output from the inverter circuit; and
    a circuit for computing a difference between a first state of the DCD of the clock signal corresponding to the input common mode voltage of the inverter circuit being set to a high voltage and a second state of the DCD of the clock signal corresponding to the input common mode voltage of the inverter circuit being set to a low voltage and for comparing the computed difference to a threshold value and adjusting a level of the programmable bias current based on the comparison.

14. The apparatus of claim 13, wherein if the computed difference is greater than the threshold value, the level of the programmable bias current is increased.

15. The apparatus of claim 13, wherein if the computed difference is less than the threshold value, the level of the programmable bias current is decreased.

16. The apparatus of claim 13, wherein the DCM circuit comprises a clock circuit for performing a random walk across a sampling period of the clock signal output from the inverter circuit.

17. A method of measuring a slew rate in a current integrating phase interpolator (CIPI) having a programmable bias current, the method comprising:
    setting a common-threshold voltage of an Inverter to a low level;
    measuring a first duty cycle distortion (DCD) of a signal at an output of the Inverter corresponding to the low level common-threshold voltage;
    setting the common-threshold voltage of the AC coupled inverter to a high level;
    measuring a second DCD of the signal at the output of the Inverter corresponding to the high level common-threshold voltage;
    comparing a difference between the first and second DCDs to a threshold value; and
    adjusting a programmable bias current of the CIPI based on a result of the comparing.

18. The method of claim 17, wherein the adjusting comprises increasing a level of the programmable bias current if the difference is greater than the threshold value and the adjusting comprises decreasing the level of the programmable bias current if the difference is less than the threshold value.

19. The method of claim 17 further comprising, prior to the comparing, computing the difference between the first and second DCDs.

20. The method of claim 17 further comprising performing a random walk across a sampling period of a clock signal output from the inverter circuit.

* * * * *